United States Patent
Godwin et al.

(10) Patent No.: US 9,107,310 B2
(45) Date of Patent: Aug. 11, 2015

(54) ELECTRONICS MODULE

(71) Applicant: Continental Automotive Systems US, Inc., Auburn Hills, MI (US)

(72) Inventors: James G. Godwin, Rochester, MI (US); Kevin Douglas Moore, Hoffman Estates, IL (US); Patrick Su, Shelby Township, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 93 days.

(21) Appl. No.: 14/065,703

(22) Filed: Oct. 29, 2013

(65) Prior Publication Data

US 2014/0166331 A1 Jun. 19, 2014

Related U.S. Application Data

(60) Provisional application No. 61/737,849, filed on Dec. 17, 2012.

(51) Int. Cl.
*H05K 5/06* (2006.01)

(52) U.S. Cl.
CPC .................................... *H05K 5/062* (2013.01)

(58) Field of Classification Search
USPC .................. 174/50, 50.5; 411/107, 190, 204; 403/34
See application file for complete search history.

(56) References Cited

U.S. PATENT DOCUMENTS 6,176,265 B1 * 1/2001 Takahashi et al. ....... 137/625.48

* cited by examiner

*Primary Examiner* — Dhirubhai R Patel

(57) ABSTRACT

An electronics module includes a module housing having a base structure and a plurality of side walls. A module cover contacts the side walls and is connected to the module housing via at least one fastener. The module housing includes at least one fastener boss for receiving the at least one fastener. Each of the fastener bosses includes a fastener hole protruding partially into the fastener boss and a vent hole connecting the fastener hole to an opening on a surface of the fastener boss exterior to the module housing, and a sealant disposed in the fastener boss, thereby preventing external air from entering the electronics module through a fastener connection.

16 Claims, 3 Drawing Sheets

ELECTRONICS MODULE

CROSS-REFERENCE TO RELATED APPLICATIONS

This disclosure claims priority to U.S. Provisional Application No. 61/737,849, which was filed on Dec. 17, 2012 and is incorporated herein by reference.

TECHNICAL FIELD

The present disclosure relates generally to electronics modules, and more particularly to waterproof and weatherproof electronics modules.

BACKGROUND OF THE INVENTION

Electronics modules for vehicle applications such as vehicle power trains, engine controls, and similar purposes are frequently exposed to water, dirt, engine fluids and other environmental hazards during standard operating conditions. To protect the electronics within the electronics module, the electronics module is sealed to a module cover using fasteners. The joint between the module cover and the housing is sealed using known sealing techniques, such as welding or adhesives.

In order to ensure that outside elements do not enter the electronics module via the fastener holes, a liquid sealant is placed in a fastener boss that receives and retains a fastener. The fastener is inserted into the fastener boss, through the module cover, displacing the liquid sealant. During this process, air trapped within the fastener boss below the liquid sealant is also displaced. The displaced air passes through the liquid sealant prior to curing and is vented out the top of the fastener boss into the interior of the electronics module. Once the liquid sealant has cured, the fastener holes are considered sealed.

As a result of the air venting through the liquid sealant, voids are formed in the liquid sealant prior to the sealant curing and remain after the sealant has cured. The voids can create leakage paths through the sealant or damage the adhesion of the sealant resulting in insufficient sealing of the electronics module at the fastener location. The insufficient sealing decreases the life span of the seal and allows water and other fluids to leak into the electronics module.

SUMMARY OF THE INVENTION

Disclosed is an electronics module including: a module housing having a base structure and a plurality of side walls, a module cover contacting the side walls, the module cover being connected to the module housing via at least one fastener, the module housing including at least one fastener boss for receiving the at least one fastener, each of the fastener bosses including a fastener hole protruding partially into the fastener boss and a vent hole connecting the fastener hole to an opening on a surface of the fastener boss exterior to the module housing, and a sealant disposed in the fastener boss, thereby prevent external air from entering the electronics module through a fastener connection.

Also disclosed is a method for sealing an electronics module housing including the steps of disposing a liquid sealant on a first end of a fastener boss, passing a fastener through a cover of the module housing, and receiving the fastener in the fastener boss, venting air exterior to the electronics module housing from the fastener boss through a vent, and allowing the liquid sealant to cure, thereby sealing the electronics module housing.

Also disclosed is a fastener boss for an electronics module including a fastener receiving hole extending from a first axial end of the fastener boss partially into the fastener boss along an axis defined by the fastener boss and a vent hole connecting the receiving hole to a vent on an exterior surface of the fastener boss, wherein the vent hole is located on a portion of the fastener boss external to a module housing.

These and other features of the present invention can be best understood from the following specification and drawings, the following of which is a brief description.

DETAILED DESCRIPTION OF AN EMBODIMENT

Figure 1:
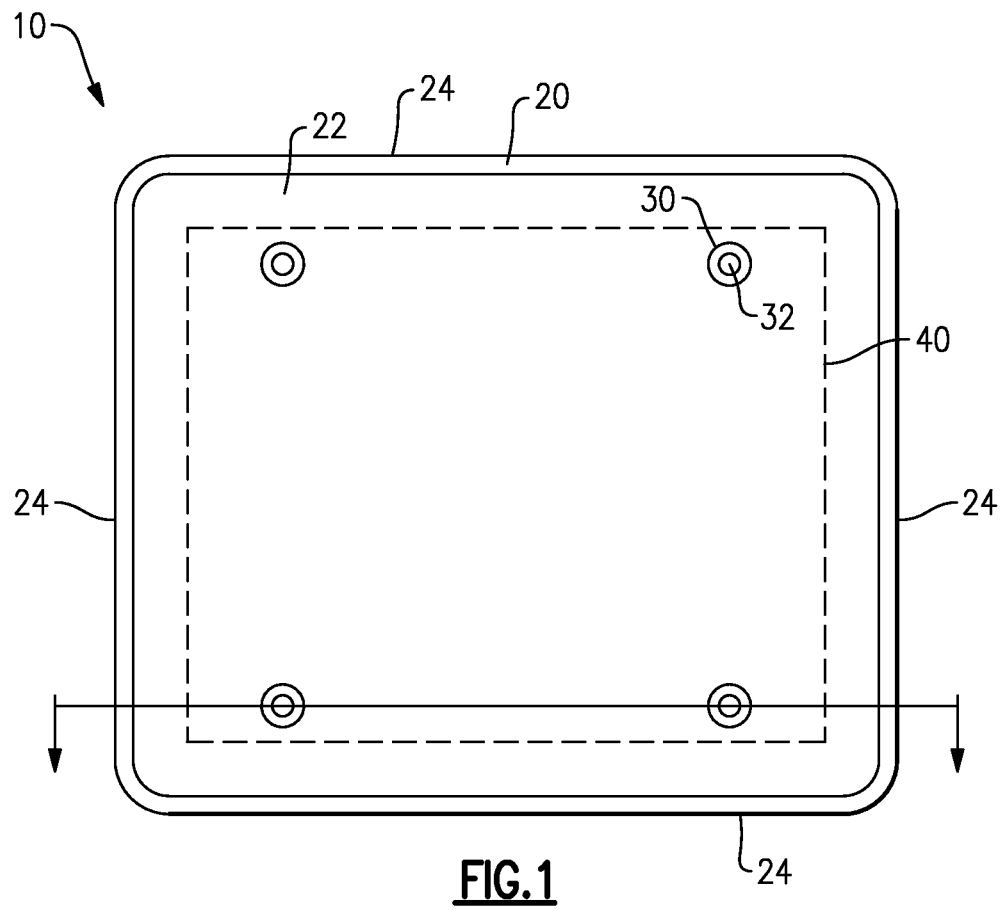
FIG. 1 schematically illustrates a top view of an electronics module housing.
Figure 2:
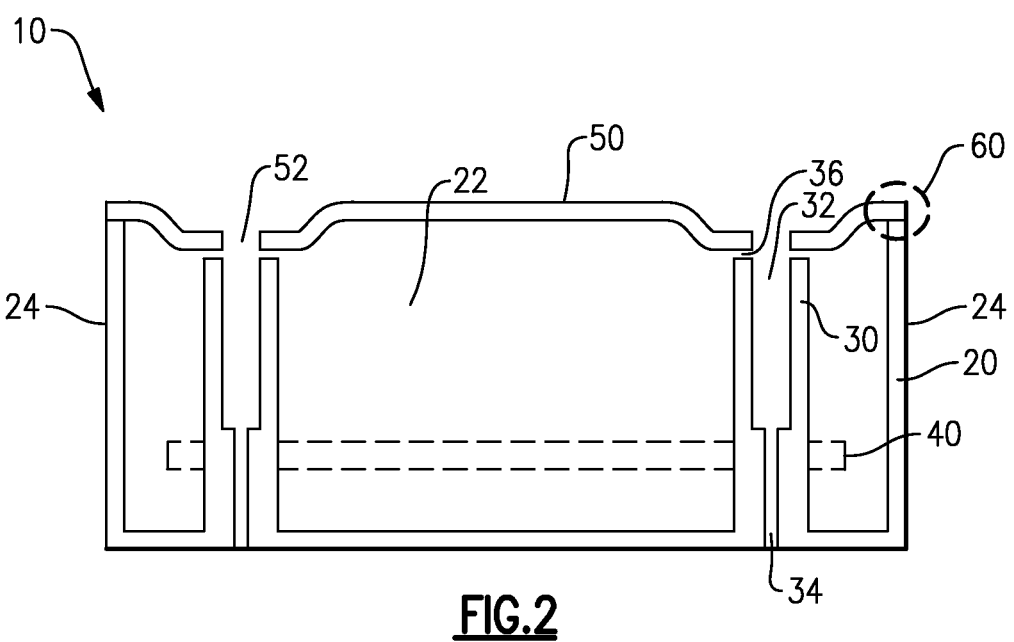
FIG. 2 schematically illustrates a side view of the electronics module of FIG. 1 cut along a section view line A.

FIG. 1 schematically illustrates an electronics module 10 and FIG. 2 schematically illustrates a cross sectional view of the electronics module 10 of FIG. 1 along a view line A. The electronics module 10 includes a module housing 20 defining a housing cavity 22. The module housing 20 can be constructed via any known construction technique such as stamping, milling, or the like. Multiple fastener bosses 30 protrude upward from a base of the cavity 22 towards an opening defined by walls 24 of the module housing 20. Disposed within the electronics module 10 is a circuit board 40, or other electronic device. The circuit board 40 is mounted to the fastener bosses 30 via any known method. In alternate examples, the circuit board 40 is mounted to the walls 24 of the housing 20. While illustrated herein as a rectangular housing 20 and a rectangular circuit board 40 for illustrative purposes, one of skill in the art having the benefit of this disclosure will appreciate that any shape housing 20 and circuit board 40 can be utilized in place of the illustrated rectangular housing 20.

In order to prevent water, dirt, or other engine fluids from entering the electronics module 10, a cover 50 is disposed over the cavity 22 and contacts each of the walls 24 at a joint 60. The cover 50 is sealed to the walls 24, using a known sealing method such as welding, an adhesive bonding agent or the like. The cover 50 is further connected to the module housing 20 via fasteners that protrude through fastener holes 52 in the cover 50 and are received in a fastener hole 32 of a corresponding fastener boss 30. The fasteners hold the cover 50 in contact with the module housing 10 at the joint 60, and the connection between the cover 50 and the fastener boss 30 at the fastener holes 52 is sealed.

In an assembled embodiment, fasteners protrude through the fastener holes 52 and are received in the fastener bosses 30. The fasteners serve to maintain the cover 50 in position relative to the housing 20. When the joint 60 between the walls 24 and the cover 50 is sealed, the only passages into or out of the sealed electronics module 10 are through fastener holes 52 in the cover, and the fastener receiving holes 32 in the fastener bosses.

Each of the fastener bosses 30 includes a fastener hole 32, having a circumference that is sized to receive a corresponding fastener. Axially aligned with each fastener hole 32 is a vent 34. The vent 34 is a through hole and provides a passage for air to be displaced from the fastener boss 30 without being displaced into the cavity 22 of the electronics module 10 and without passing through a sealant. When a fastener is inserted into the fastener boss 30. In one example embodiment, the fastener received in the fastener boss 30 is a threaded screw, and an interior surface of the fastener boss 30 is threaded in a complimentary manner to the threading of the screw. In alternate examples, the fastener can be connected to the fastener boss 30 using an adhesive or other fastener means, and threading is not necessary.

As can be appreciated from FIG. 2, a small gap 36 exists between the cover 50 and each of the fastener bosses 30. Absent a sealant at the gap 36, a leakage pathway into the electronics module 10 can exist even after a fastener has been inserted connecting the cover 50 to the fastener boss 30.

Figure 3:
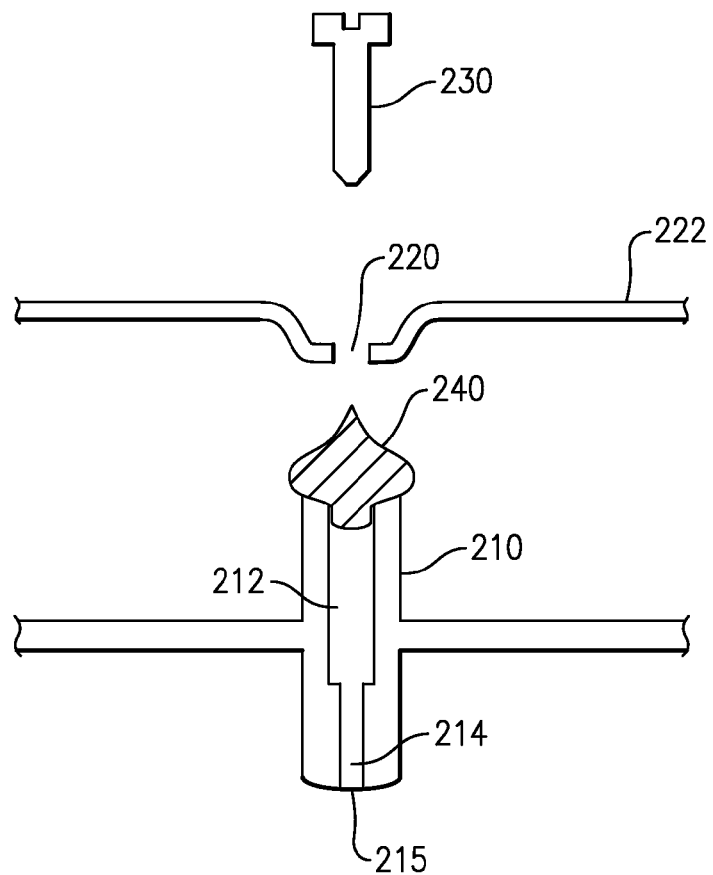
FIG. 3 schematically illustrates a cross sectional view of a fastener and a fastener boss for an electronics module in an unassembled position.

FIG. 3 illustrates an example fastener boss 210, a corresponding fastener hole 220 in a cover 222 and a fastener 230 ready to be inserted into the fastener boss 210. Disposed on top of the fastener boss 210, and partially protruding into a receiving hole 212 of the fastener boss 210 is a liquid sealant 240. In order to prevent the liquid sealant from running down the receiving hole 212 prematurely, a liquid sealant 240 having a relatively high viscosity is utilized. As the fastener 230 is inserted into the receiving hole 212, the liquid sealant 240 is displaced, with a portion of the liquid sealant 240 remaining at the top of the fastener boss 210 and a portion of the liquid sealant 240 being forced into the receiving hole 212 by the fastener 230. As the fastener 230 displaces the liquid sealant 240 into the receiving hole 212, air currently in the receiving hole 212 is also forced down, and is vented out of the fastener boss 210 through an exit hole 215 on a vent 214.

In the illustrated example of FIG. 3, the vent 214 is aligned with the receiving hole 212 and the exit hole 215 is positioned axially opposite the fastener 230. In alternate examples, the exit hole 215 of the vent 214 can be located on the side of the fastener boss 210. In yet further alternate examples the vent 214 can be positioned at an angle relative to an axis defined by the receiving hole 212 in the fastener boss 210. In each of the examples, the exit hole 215 of the vent 214 is positioned at a portion of the fastener boss 210 external to the cavity defined by the electronics module housing 20, thereby allowing for the air trapped below the liquid sealant 240 in the fastener boss 210 to be vented outside of the electronics module.

Figure 4:
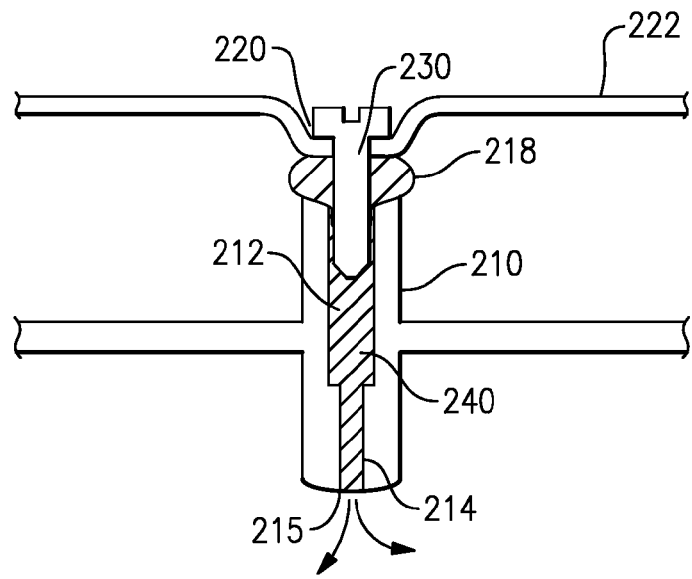
FIG. 4 schematically illustrates a cross sectional view of a fastener and a fastener boss for an electronics module in an assembled position.

With continued reference to FIG. 3, and with like numerals indicating like elements, FIG. 4 illustrates the example fastener boss 210, fastener hole 220 and cover 222 of FIG. 3, with the fastener 230 in an installed position and the liquid sealant 240 fully cured. As can be seen, the fastener 230 has forced the liquid sealant 240 to fill the receiving hole 212 and the vent 214. The liquid sealant 240 has fully displaced the air within the fastener boss 210. In alternate examples, a portion of the air can be allowed to remain in the fastener boss 210. In yet further alternate examples, excess liquid sealant 240 can be used, and the excess liquid sealant 240 protrudes from the exit hole 215 as the liquid sealant 240 is displaced. In the examples utilizing excess liquid sealant 240, the excess liquid sealant 240 extrudes out the exit hole 215 as the fastener 230 is installed into the fastener boss. The excess liquid sealant 240 can then be scraped off, or otherwise removed from, the end of the fastener boss 210 before the liquid sealant 240 has fully cured.

After the fastener 230 is installed, a portion of the liquid sealant 240 remains at the top of the fastener boss 210 as a sealant bulge 218. The relative size of the illustrated sealant bulge 218 is exaggerated for illustrative purposes, and can be any thickness allowing the liquid sealant 240 to contact both the cover 222 and the fastener boss 210. Once the liquid sealant 240 has been allowed to cure, the fastener hole 220 is then also sealed as a result of the bulge 218.

Figure 5:
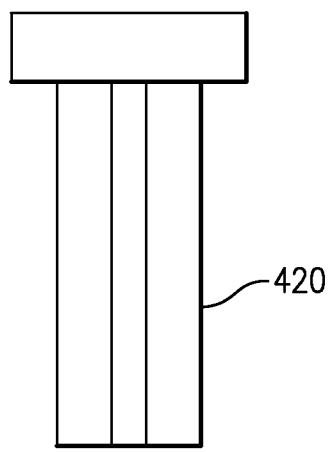
FIG. 5 schematically illustrates an alternate fastener and fastener boss that can be utilized in the electronics modules of the previous examples.
Figure 5:
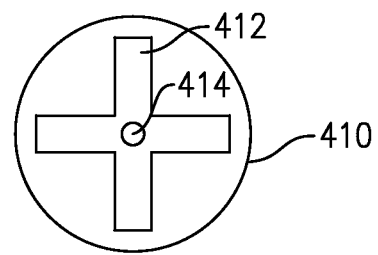

FIG. 5 illustrates an alternate example fastener boss 410 and fastener 420. In the illustrated alternate example, the liquid sealant described above includes an adhesive property that adheres the fastener 420 to the interior surfaces of the fastener boss 410 in addition to providing the aforementioned sealing properties. Because of the adhesive properties, the fastener 420 can be constructed to any specified geometry, and the fastener boss 410 can include a correspondingly shaped fastener hole 412. As with the previously described fastener bosses, the fastener boss 410 also includes a vent 414.

When the fastener 420 is inserted into the fastener hole 412 in the fastener boss 410, a portion of the liquid sealant (not illustrated) coats the outer surface of the fastener 420. The liquid sealant on the outer surface of the fastener 420 also contacts the inner surfaces of the fastener hole 412 in the fastener boss 410. As the liquid sealant cures, the adhesive properties of the liquid sealant adhesive adhere the outer surface of the fastener 420 to the inner surface of the fastener hole 412.

By using an adhesive sealant and the above described configuration, unique geometries, such as the illustrated cross shaped geometry, can be utilized for the fastener. The unique geometries allow for keyed fasteners, or specialized shaping of the fastener boss 210 for particular applications. Further, any alternate geometry can be utilized, and the fastener geometry is not limited to the illustrated geometries. In alternate examples using an adhesive liquid sealant, the fastener 420 and the fastener boss 210 can be a standard screw type fastener, thereby increasing the holding ability of the fastener. In further alternate examples, the fastener can be riveted, a post, or any other suitable fastener topology.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronics module comprising:
    a module housing including a base structure and a plurality of side walls;
    a module cover contacting said side walls, the module cover being connected to the module housing via at least one fastener;
    the module housing including at least one fastener boss for receiving the at least one fastener; each of said fastener bosses including a fastener hole protruding partially into the fastener boss and a vent hole connecting said fastener hole to an opening on a surface of said fastener boss exterior to said module housing;
    a sealant disposed in said fastener boss, thereby preventing external air from entering the electronics module through a fastener connection.

2. The module of claim 1, wherein the sealant is a cured liquid sealant.

3. The module of claim 2, wherein said cured liquid sealant is of viscous in an uncured state such that said liquid sealant does not run into said fastener hole.

4. The module of claim 1, wherein the sealant is an adhesive and wherein the sealant adheres at least one external surface of the at least one fastener to an internal surface of the at least one fastener boss.

5. The module of claim 4, wherein the at least one fastener is a non-cylindrical fastener.

6. The module of claim 4, wherein the at least one fastener is a threaded fastener and wherein said interior surface of the at least one boss includes threading complimentary to threading of said threaded fastener.

7. The module of claim 4, wherein the at least one fastener is a threaded fastener and wherein said interior surface of the at least one boss lacks threading such that insertion of the at least one fastener creates complimentary threading on said interior surface.

8. The module of claim 1, wherein each vent hole is aligned with the corresponding fastener hole.

9. The module of claim 1, wherein said sealant further comprises a sealant bulge protruding from a first end of said fastener boss such that said sealant bulge contacts said cover and said fastener boss.

10. The module of claim 9, wherein said sealant contacts said cover along a full circumference of said fastener hole, thereby sealing said module at said at least one fastener.

11. The module of claim 1, wherein an axis defined by said vent hole is not aligned with an axis defined by said fastener hole.

12. A method for sealing an electronics module housing comprising the steps of:
  disposing a liquid sealant on a first end of a fastener boss;
  passing a fastener through a cover of said module housing, and receiving the fastener in said fastener boss;
  venting air exterior to said electronics module housing from said fastener boss through a vent; and
  allowing said liquid sealant to cure, thereby sealing said electronics module housing.

13. The method of claim 12 further comprising the step of sealing a joint between a cover of said electronics module and a module housing of said electronics module via at least one of a sealant bonding agent and a weld.

14. The method of claim 12, wherein the step of passing a fastener through a cover of said module housing and receiving the fastener in said fastener boss further comprises displacing said liquid sealant into said fastener boss thereby forcing air in said fastener boss into a vent in said fastener boss.

15. The method of claim 12, wherein the step of allowing said liquid sealant to cure further comprises adhering at least one exterior surface of said fastener to at least one interior surface of said fastener boss.

16. The method of claim 12, wherein said step of passing said fastener through said cover of said module housing further comprises rotating said fastener such that threads of said fastener create complimentary threads within said fastener boss.

* * * * *